United States Patent [19]

Wu

[11] Patent Number: 5,877,053
[45] Date of Patent: Mar. 2, 1999

[54] METHOD OF FABRICATING DRAM CELL WITH CAPACITOR HAVING MULTIPLE CONCAVE STRUCTURE

[75] Inventor: Shye Lin Wu, Taichung, Taiwan

[73] Assignee: Acer Semiconductor Manufacturing Inc., Hsinchu, Taiwan

[21] Appl. No.: 998,933

[22] Filed: Dec. 29, 1997

[30] Foreign Application Priority Data

Jul. 28, 1997 [CN] China .................................. 86110836

[51] Int. Cl.⁶ .............................................. H01L 21/8242
[52] U.S. Cl. ............................................ 438/254; 438/397
[58] Field of Search .................................... 438/238, 239, 438/253–256, 381, 396–399

[56] References Cited

U.S. PATENT DOCUMENTS 5,104,821   4/1992   Choi et al. .................................. 437/52
5,459,344  10/1995   Wakamiya et al. ...................... 257/307
5,565,029  10/1996   Takasu ........................................ 117/1
5,691,115  11/1997   Okamoto et al. ........................ 430/311

*Primary Examiner*—Joni Chang
*Attorney, Agent, or Firm*—Robert H. Chen

[57] ABSTRACT

This invention discloses a novel design for increasing the surface area of a stacked capacitor used in DRAM devices. The upper and lower plates of the capacitor comprises of several concave structures. The concave structures are first produces on an LS-SOG layer using focused ion beam lithography, which is then mapped to the lower plate of the capacitor. A dielectric layer is deposited, after which an upper plate is formed. The concave structures increases the plate area, thereby increasing charge storage capacity.

20 Claims, 5 Drawing Sheets

METHOD OF FABRICATING DRAM CELL WITH CAPACITOR HAVING MULTIPLE CONCAVE STRUCTURE

BACKGROUND OF THE INVENTION

1. Field of the Invention

This invention relates generally to a method of fabricating semiconductor memory cells having stacked capacitors, and more particularly to a method of fabricating stacked capacitor DRAM devices having concave structures.

2. Background of the Invention

A DRAM (Dynamic Random Access Memory) cell is a semiconductor memory device typically comprising one access transistor and one capacitor, in which one bit of data is stored in a cell by using an electric charge. One terminal of the capacitor is connected to the source of the access transistor. Another terminal of the capacitor is connected to a reference voltage. The transistor gate electrode is connected to external connection lines, e.g., bit lines or word lines.

Advances in computer applications have increased the demand for higher capacity memory chips. Decreasing the size of the memory cells allows more memory cells to be packed into an integrated circuit. A capacitor comprises of a lower conducting plate, a dielectric layer, and an upper conducting plate. The capacitance is proportional to the surface area of the conducting plates and the dielectric layer. As the area of the memory cell is decreased, the capacitance of the capacitors tends to decrease also, lowering the performance of the memory cells.

In order to increase the density of memory cells, stacked capacitors have been proposed. Stacked capacitors are made by partially stacking the storage capacitor on top of the access transistor and on top of the bit/word line, thereby effectively reducing the area used for each memory cell. Methods for further increasing the capacitance of the stacked capacitor include increasing the surface area of the capacitor plates and increasing the dielectric constant of the capacitor insulating layer.

Various methods have been proposed to increase the surface area of the electrodes of the capacitors. Because of the small size of the capacitors, it is difficult to use lithography methods to form small corrugations due to light diffraction effects. One method that has been proposed is to use ring shaped, or bathtub shaped capacitors, utilizing the side walls of the ring shape structure to increase the surface area of the capacitor plates. FIG. 1 is a cross sectional view of a stacked capacitor DRAM cell. The capacitor has a ring shape, or bathtub shape, structure with rising side walls. The side walls increase the surface area of the dielectric layer, thereby increasing the capacitor capacitance. These capacitors are fabricated using complex procedures, including a plurality of deposition, patterning, and etch-back processes. As the dimensions of the DRAM devices are further decreased, however, even this ring shaped configuration can not provide sufficient capacitance.

Recently, a method of using focused ion beam (FIB) lithography on ladder silicone spin-on glass (LS-SOG) has been proposed. The LS-SOG acts as a positive photoresist of FIB, which is patterned by exposure to ion radiation, and etched back by buffered hydrofluoric acid (BHF). (Reference: K. Suzuki, et al., JPn., J. Appl. Phys., vol. 35, P.6517, 1996). The ion-irradiated part of the LS-SOG is etched away by BHF, and a "U-shaped" cross section structure is formed in the unirradiated region due to the special property intrinsic to the LS-SOG. The smallest dimension available by the focused ion beam lithography is about 0.1 micron.

SUMMARY OF THE INVENTION

What is needed, therefore, is a method for forming DRAM cells with stacked capacitors fabricated using FIB lithography, the capacitors having multiple concave structures to increase the surface area of the electrode plates, and thereby increasing the capacitance of the capacitors.

The present invention discloses a method of forming a DRAM cell having a stacked capacitor with multiple concave and convex structures resulting in a large surface plate area. An access transistor is first formed on a semiconductor substrate. A insulating layer is deposited over the access transistor. Then the capacitor is fabricated by first depositing an insulating layer over the access transistor, opening a contact hole to expose the source region of the access transistor, and then depositing a first conducting layer as the lower plate. A ladder silicone spin-on glass (LS-SOG) is deposited on top of the first conducting layer, soft baked, and patterned by using the focused ion beam (FIB) method, after which multiple concave structures are formed. The LS-SOG film is etched back, after which the first conducting layer is etched, transforming the concave structure in the LS-SOG film onto the first conducting layer. A thin dielectric layer is deposited over the first conducting layer, after which a second conducting layer is deposited as the upper plate.

One advantage of the present invention is that the capacitance of the stacked capacitor is greatly enhanced due to the increase in surface area for charge storage by using multiple small diameter concave structure.

Another advantage is that the multiple small diameter concave structure formed by using focused ion beam lithography can be obtained in a simpler method compared to prior art methods.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE INVENTION

Figure 1:
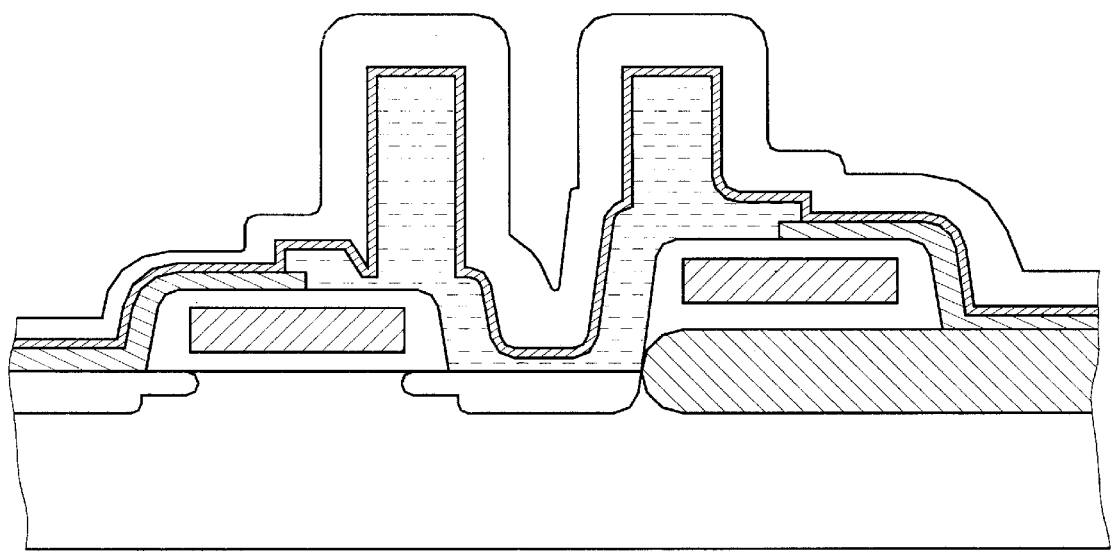
FIG. 1 is a cross sectional drawing of the prior art stacked capacitor DRAM cell.
Figure 2:
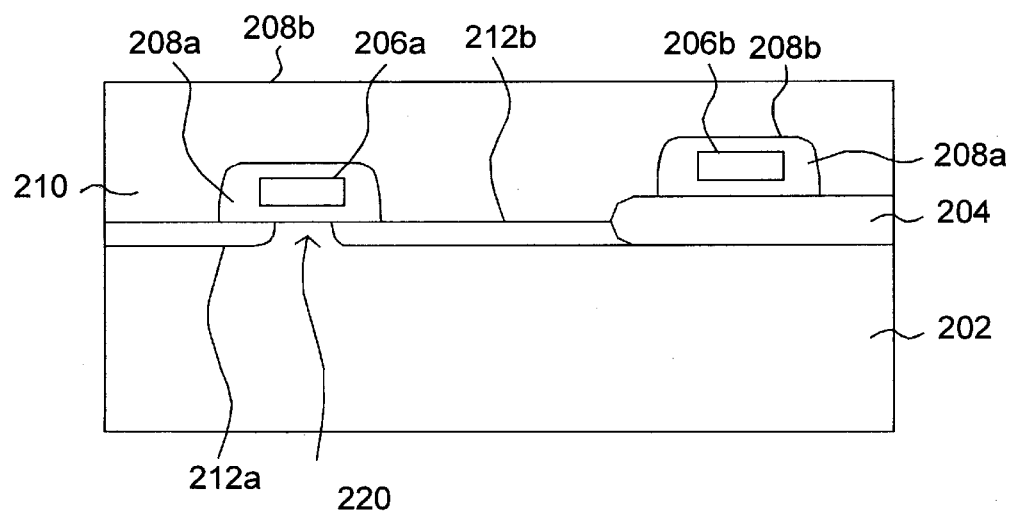
FIG. 2 is a side view of an access transistor in a DRAM cell.

FIG. 2 shows a cross sectional view of an access transistor of a DRAM cell. An insulating film 204 is formed on a semiconductor substrate 202 to provide isolation between the transistor 220 and other devices. The insulating film 204 is usually made of silicon dioxide. Gate electrodes 206a and 206b are formed over thin insulating film 208a. The gate electrodes also form the word lines in the DRAM cell arrays. The upper sides of the gate electrodes 206a and 206b are coated with insulating layer 208b. A pair of impurity diffusion layers 212a and 212b are formed on the surface region of the substrate 202 on the two sides of the gate electrode 206a. The diffusion layers 212a and 212b form the source/drain regions of the access transistor. An insulation layer 210 is then deposited over the entire area.

For purpose of clear illustration, in FIGS. 3A–3G, only the parts concerning the stacked capacitor are shown, while the parts concerning the access transistor are omitted. The access transistor is made using a conventional process.

Figure 3A:
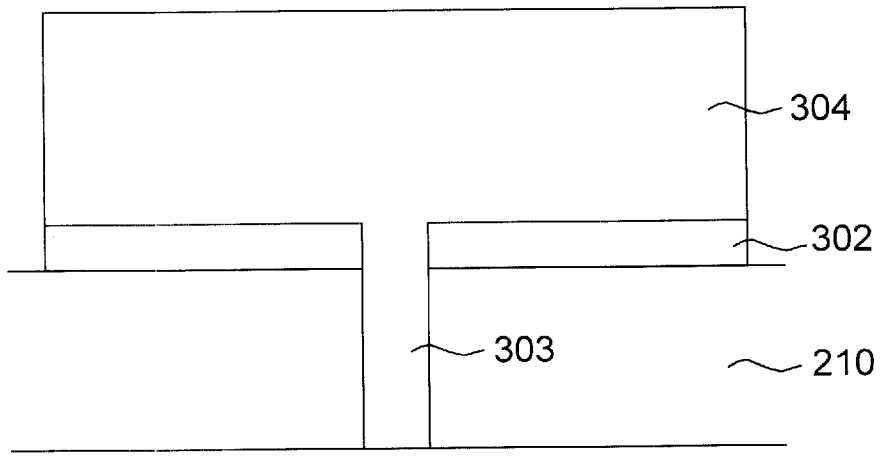
FIGS. 3A–3G are cross sectional views illustrating the manufacturing steps of a semiconductor device according to the embodiment of the present invention.

FIG. 3A shows an oxide layer 302 deposited over the insulating layer 210 using chemical vapor deposition (CVD) method, such as LPCVD, PECVD or ECRCVD, etc. The insulating layer 210 and the oxide layer 302 are patterned and etched to form a contact hole 303. A first polycrystalline silicon layer 304 is formed above the oxide layer 302 using low pressure CVD method. The polycrystalline silicon fills into the contact hole 303 and comes into contact with the diffusion layer 212b, coupling the later formed capacitor to the access transistor. The first polycrystalline silicon layer 304 forms the first conducting plate of the capacitor. The first polysilicon layer 304 is doped with phosphorous to increase conductivity.

Figure 3B:
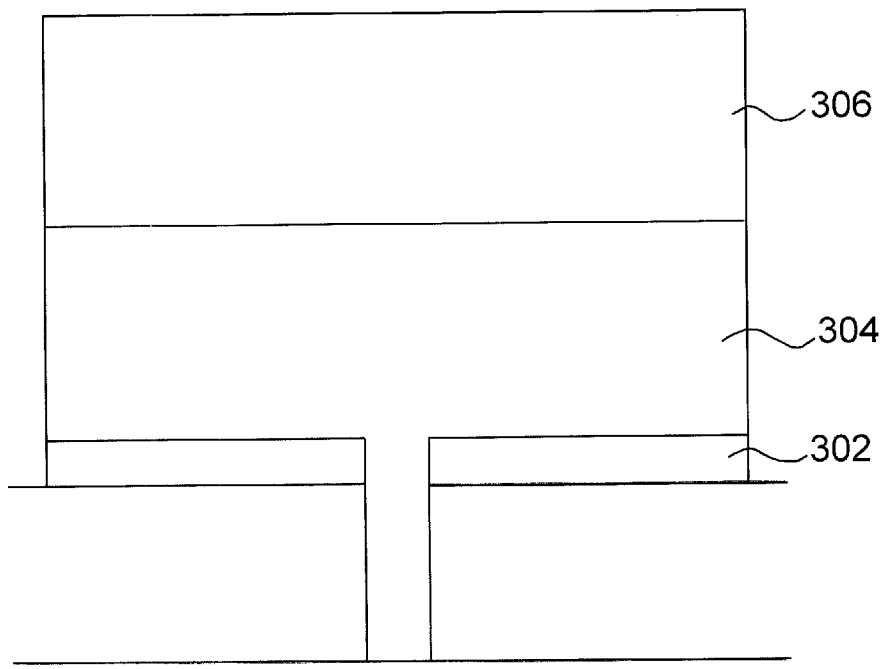

FIG. 3B shows an LS-SOG layer 306 coated above the first polycrystalline silicon layer 304. The LS-SOG is a material such as the "Glass Resin" supplied by Showa Dendo Co. The LS-SOG is spin-coated onto the first polycrystalline silicon layer 306 to a thickness of 100–2000 nm, and then soft baked at a temperature of 50–150 C. The LS-SOG layer 306 is exposed to a focused ion beam with an ion energy of about 100–500 kV. Then a post-exposure baking is performed in a N ambient or diluted O ambient environment.

Figure 3C:
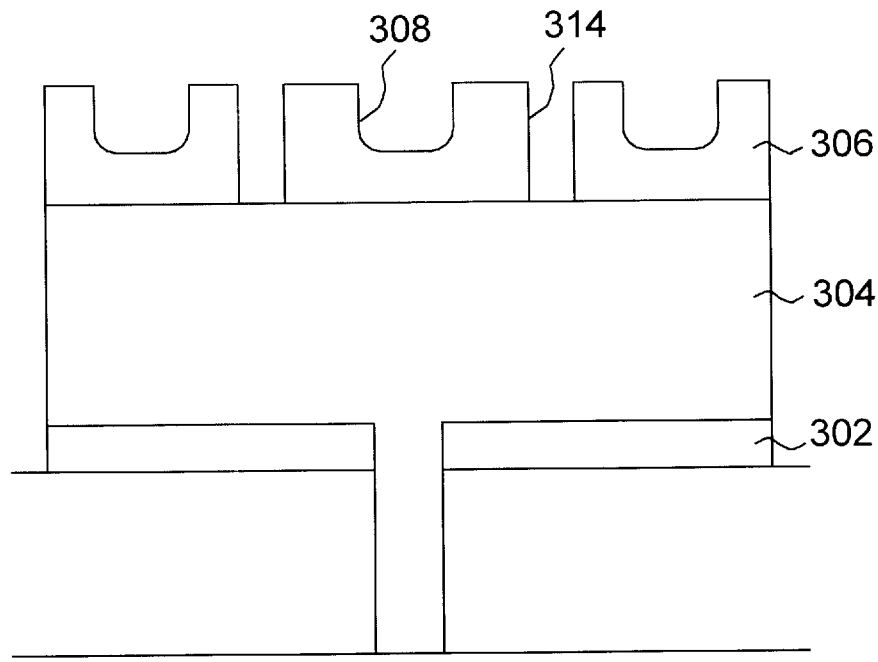

FIG. 3C shows the cross section of the concave structure after patterning by focused ion beam lithography. The pattern for the focused ion beam lithography mask may have rectangular or circular dark areas. After being exposed to focused ion beam, the LS-SOG 306 layer is etched using buffered hydrofluoric acid (BHF). The parts irradiated by the focused ion beam is etched away, exposing the first polycrystalline silicon layer 304. The parts not irradiated by the focused ion beam form isolated islands 314 and have concave structures 308 thereon. The concave structures 308 are formed due to the special property of the LS-SOG 306 (see reference K. Suzuki, et al., JPn., J. Appl. Phys., vol. 35, P.6517, 1996).

Figure 3D:
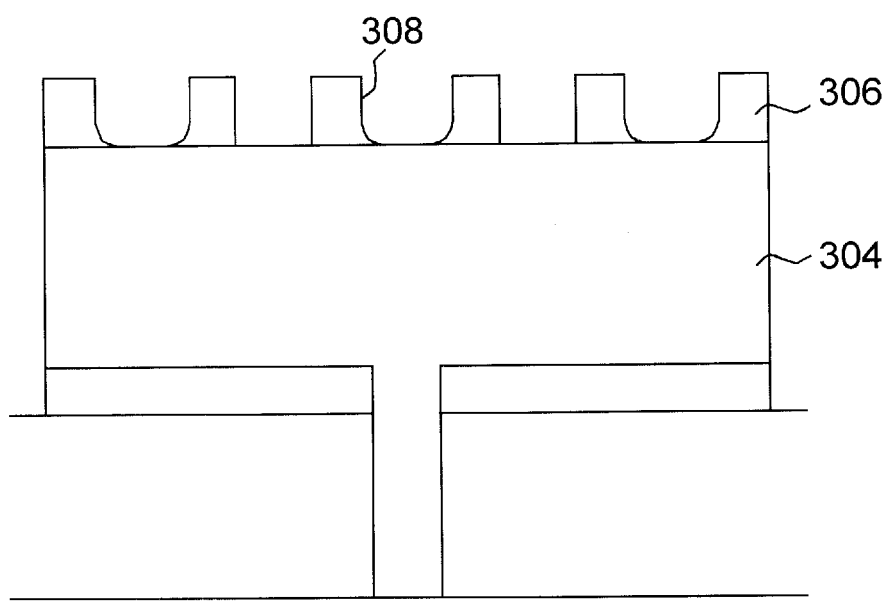

FIG. 3D shows residual LS-SOG film after etch-back to partially expose the first polycrystalline silicon layer 304 under the concave structure 308. Anisotropic dry etching method, such as RIE (reactive ion etching), is used so that the concave structure is preserved after etch back.

Figure 3E:
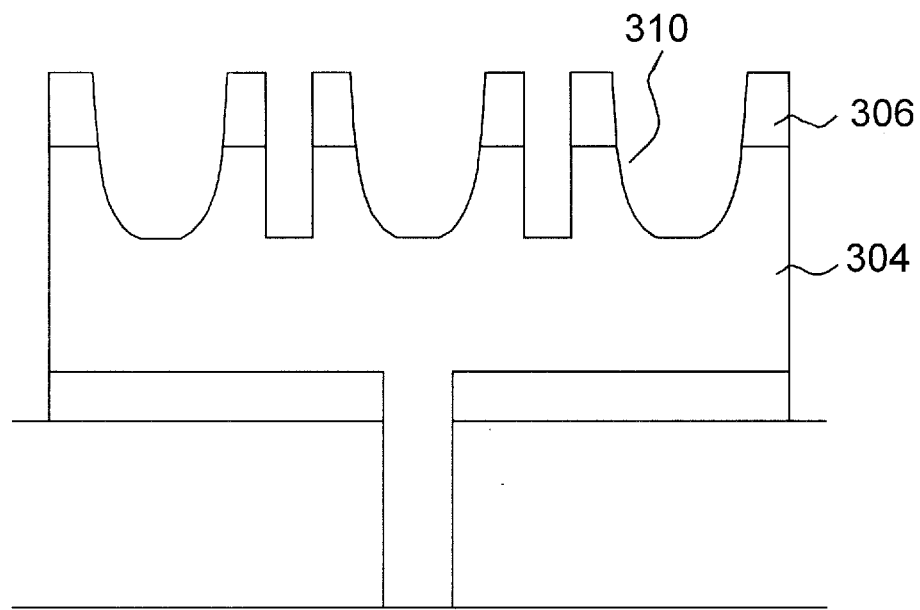

FIG. 3E shows the formation of concave structures after anisotropic dry etching of the first polycrystalline silicon layer 304. The residual LS-SOG layer 306 is used as mask during etching. During the etching process, the residual LS-SOG layer 306 is also etched, but at a much slower rate. Therefore, the portion of the first polycrystalline silicon layer 304 under the center of the concave structure 308 is etched deeper than the portion closer to the outer rim of the concave structure 308. In this way, a concave structure 310, or crown-shape structure, is formed in the first polycrystalline silicon layer 304.

Figure 3F:
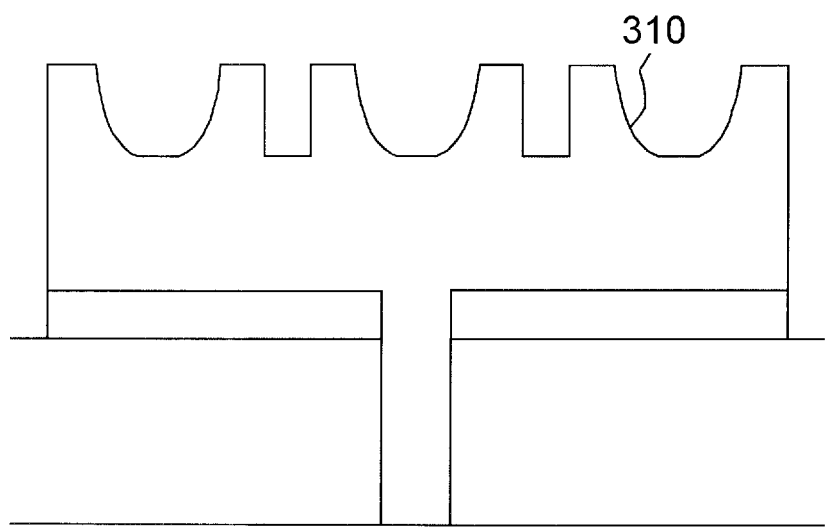

FIG. 3F shows the concave structure 310 in the first polycrystalline silicon layer 304 after removal of the residual LS-SOG layer 306. The residual LS-SOG layer is removed by using BOE or diluted HF solution or dry etching.

Figure 3G:
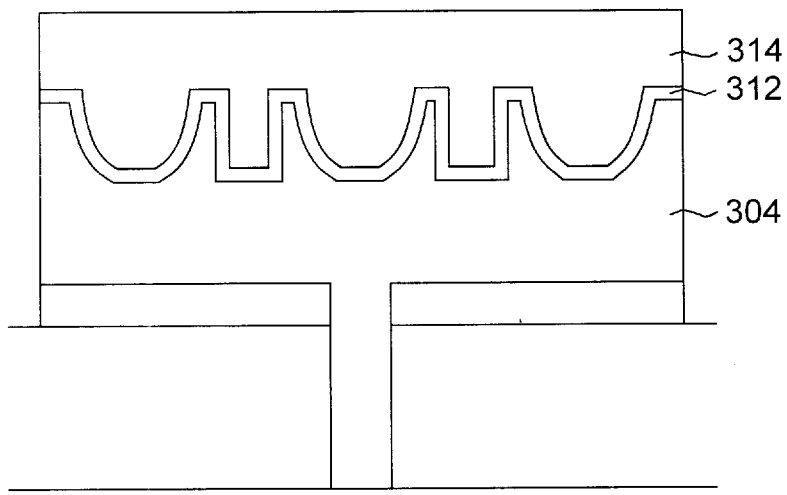

FIG. 3G shows the cross sectional view of the stacked capacitor after depositing a thin dielectric film 312 (ONO, $Ta_2O_5$, PZT, or BST) and a second polycrystalline silicon layer 314 (preferably doped with ions to increase conductivity). The ONO film is formed by first depositing a thin layer of silicon oxide, then depositing a thin layer of silicon nitride, after which a second thin layer of silicon oxide is deposited. The second polycrystalline silicon layer 314 forms multiple convex structure, the convex structure being the complement of the concave structure 310 (or crown-shape structure) in the first polycrystalline silicon layer 304. The second polycrystalline silicon layer 314 is used as the second conducting plate of the capacitor.

Figure 4:
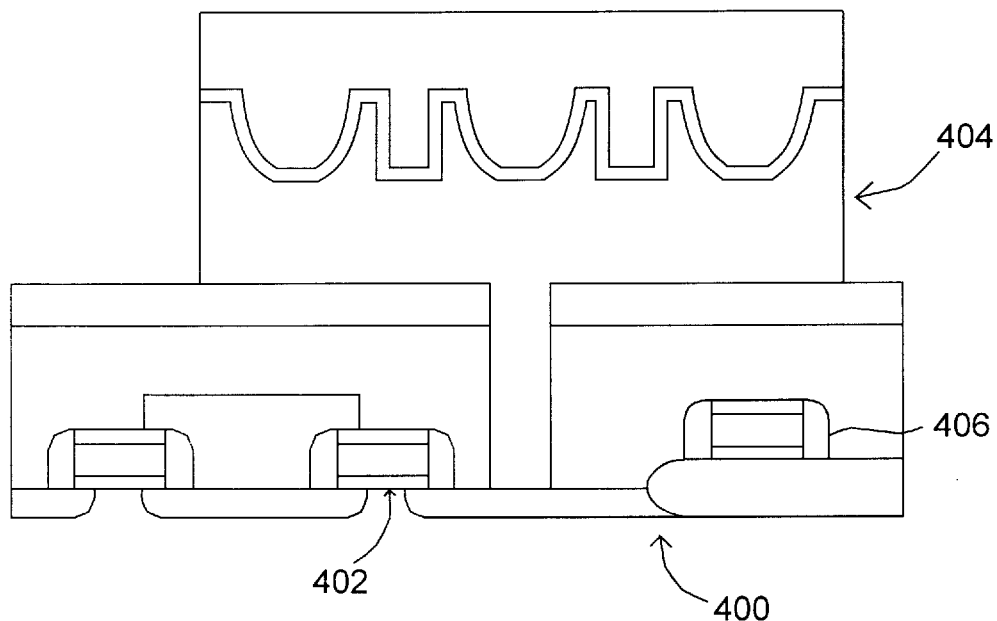
FIG. 4 is a cross sectional view of the DRAM device using the capacitor according to the embodiment of the present invention.

FIG. 4 is a cross sectional view of a DRAM cell 400 utilizing the capacitor structure of the present invention. The DRAM cell 400 includes an access transistor 402 and a stacked capacitor 404. As can be seen from the figure, the area between the first and second conducting plates of the capacitor is greatly increased by the concave and convex structures of the conducting plates. Also shown in the figure is a word line 406 adjacent to the access transistor 402. By stacking capacitors on top of word lines, the density of the DRAM cell can be increased.

While the above is a full description of the specific embodiments, various modifications, alternative constructions and equivalents may be used. For example, the number of crown structures can be varied according to the size of the capacitor, etc. Therefore, the above description and illustrations should not be taken as limiting the scope of the present invention which is defined by the appended claims.

What is claimed is:

1. A method for fabricating a charge storage device, the steps comprising:
    (a) forming a first conducting layer;
    (b) depositing a spin-on glass layer over said first conducting layer;
    (c) forming at least one concave structure on said spin-on glass layer by using focused ion beam lithography;
    (d) forming at least one concave structure in said first conducting layer by etching back said spin-on glass layer and said first conducting layer;
    (e) depositing a dielectric layer over said first conducting layer; and
    (f) depositing a second conducting layer over said dielectric layer.

2. The method of claim 1, further comprising a step, immediately following step (d), of removing any residue from said spin-on glass layer.

3. The method of claim 1, wherein said spin-on glass is ladder silicone spin-on glass.

4. The method of claim 1, wherein said insulating layer is silicon oxide.

5. The method of claim 1, wherein said first conducting layer is made from a material selected from a group consisting of polycrystalline silicon and amorphous silicon.

6. The method of claim 1, wherein said second conducting plate is made from a material selected from a group consisting of polycrystalline silicon and amorphous silicon.

7. The method of claim 1, wherein said step of etching back said spin-on glass layer uses anisotropic dry etching method.

8. The method of claim 1, wherein said focused ion beam has an energy of 100–500 kV.

9. The method of claim 1, wherein a soft-baking process is performed just prior to the step of focused ion beam lithography.

10. The method of claim 9, wherein the step of performing soft baking of said spin-on glass bakes said spin-on glass at a temperature of about 50 to 150 degrees Celsius.

11. The method of claim 1, wherein the material of said dielectric layer is selected from a group consisting of ONO, $Ta_2O_5$, PZT, and BST.

12. A method for fabricating a stacked capacitor DRAM cell, the method comprising the steps of:

forming an access transistor on a semiconductor substrate;

depositing an insulating layer over said access transistor;

forming a contact hole in said insulating layer to expose part of the access transistor;

depositing a first conducting layer over said insulating layer;

depositing a ladder silicone spin-on glass layer over said first conducting layer;

performing a soft-baking of said ladder silicone spin-on glass layer;

using focused ion beam lithography to pattern said ladder silicone spin-on glass layer, forming a plurality of concave structures thereon;

etch-back said ladder silicone spin-on glass layer and said first conducting layer, forming concave structures in said first conducting layer;

removing residual said ladder silicone spin-on glass layer, revealing concave structure in said first conducting layer;

depositing a dielectric layer over said first conducting layer; and depositing a second conducting layer over said dielectric layer.

13. The method of claim 12, wherein said access transistor has a source region, said step of forming a contact hole exposes said source region.

14. The method of claim 12, wherein said concave structures are crown-shape structures.

15. The method of claim 12, further comprising a step, immediately following the step of using focused ion beam lithography, of performing a post-exposure baking process.

16. The method of claim 15, wherein the step of post-exposure baking is performed in a gas ambient environment, said gas selected from a group consisting of nitrogen and oxygen.

17. A method for fabricating a semiconductor memory device, the steps comprising:

forming an access transistor on a semiconductor substrate;

depositing an insulating layer over said access transistor;

forming a contact hole in said insulating layer to expose part of said access transistor;

depositing a first conducting layer over said insulating layer;

depositing a ladder silicone spin-on glass layer over said first conducting layer;

performing a soft-baking of said ladder silicone spin-on glass layer;

using focused ion beam lithography to pattern said ladder silicone spin-on glass layer, forming a plurality of concave structures thereon;

etch-back said ladder silicone spin-on glass layer and said first conducting layer, forming concave structures in said first conducting layer; and removing residual said ladder silicone spin-on glass layer, revealing concave structure in said first conducting layer; depositing a dielectric layer over said first conducting layer; and depositing a second conducting layer over said dielectric layer.

18. The method of claim 17, wherein said concave structures are crown-shape structures, and the step of depositing a dielectric layer over said first conducting layer deposits said dielectric layer over surfaces of said concave structures.

19. The method of claim 17, wherein the step of using focused ion beam lithography uses an ion beam energy of 100–500 KV.

20. The method of claim 17, wherein said first and second conducting layers are made of materials selected from a group consisting of polycrystalline silicon and amorphous silicon.

* * * * *